United States Patent [19]

Güntner et al.

[11] 4,356,414
[45] Oct. 26, 1982

[54] MONOLITHICALLY INTEGRABLE LOGIC CIRCUIT

[75] Inventors: Helmut Güntner, Gräfelfing; Ernst Wittenzellner, Munich, both of Fed. Rep. of Germany

[73] Assignee: Siemens Aktiengesellschaft, Berlin and Munich, Fed. Rep. of Germany

[21] Appl. No.: 113,119

[22] Filed: Jan. 17, 1980

[30] Foreign Application Priority Data

Jan. 31, 1979 [DE] Fed. Rep. of Germany ....... 2903659

[51] Int. Cl.³ .................. H03K 19/086; H03K 19/092
[52] U.S. Cl. .................................... 307/455; 307/360; 307/362; 307/475
[58] Field of Search ............... 307/445, 455, 456, 475, 307/467, 360, 362, 363, 315

[56] References Cited

U.S. PATENT DOCUMENTS 3,573,488  4/1971  Beelitz ........................... 307/475 X
4,135,103  1/1979  Fulkerson ........................ 307/475

*Primary Examiner*—John Zazworsky
*Attorney, Agent, or Firm*—Herbert L. Lerner; Laurence A. Greenberg

[57] ABSTRACT

Monolithically integrable logic circuit having at least one NAND function and a Darlington stage serving as the signal output of the circuit, including a differential amplifier having its non-inverted output connected to the input of the Darlington stage, the differential amplifier including at least two identical input transistors with control electrodes which form the signal inputs of the circuit and a reference transistor which is identical to the input transistors, the reference transistor having one of its current carrying electrodes connected to the same current carrying electrodes of the input transistors, a current source connected to the connection of the input and reference transistor electrodes, and a switch-over system including transistors and diodes for switching the input transistors to different threshold voltage values, the switch-over system being connected to the control electrode of the reference transistor.

7 Claims, 3 Drawing Figures

MONOLITHICALLY INTEGRABLE LOGIC CIRCUIT

The invention relates to a monolithically integrable logic circuit with at least one NAND function and a Darlington stage serving as the signal output.

A logic circuit of this type is described, for instance, in "Siemens Datenbuch" 1976/77, Digital Circuits, pages 421 to 425. In that description, logic gates including diodes serve as input stages.

Such circuits are well suited for many purposes. In the development of monolithically integrated semiconductor circuits, the problem frequently arises in practice of combining logic families based on different technologies, such as circuits of the TLL-series and the LSL-series, the DTL-series, the CMOS-series, etc, for example. Since, as is well known, integrated current sources with high output voltage breakdown strength (30 V for instance) are required in all commonly used logic families, such as relay drivers in switching installations, for example, it would be desirable to achieve a certain amount of uniformity in this respect, so that circuit parts belonging to different logic families can also be more easily combined with each other monolithically.

Unfortunately, the different commonly used logic families have different input and output level definitions, depending on the supply voltage range (for instance: input threshold 1.5 V for TTL and 6 V for LSL). To meet this requirement, different types of voltage sources with respectively matching input threshold voltages have been used for the group of logic series with 5 V operating voltages and for the group of logic circuits with 12 to 30 V operating voltages.

It is accordingly an object of the invention to provide a monolithically integrable logic circuit which overcomes the hereinafore mentioned disadvantages of the heretofore known devices of this general type, and which has a current source circuit which can be integrated monolithically without difficulty and the input threshold voltage of which is switched, depending on the supply voltage applied, between the two commonly used values of about 1.5 V and about 6 V, so that the circuit is suitable as a current source for all commonly used logic families with supply voltages from about 3 V to more than 30 V.

With the foregoing and other objects in view there is provided, in accordance with the invention, a monolithically integrable logic circuit having at least one NAND function and a Darlington stage serving as the signal output of the circuit, comprising a differential amplifier having its non-inverted output connected to the input of the Darlington stage, the differential amplifier including at least two identical input transistors with control electrodes which form the signal inputs of the circuit and a reference transistor which is identical to the input transistors, the reference transistor having one of its current carrying electrodes connected to the same current carrying electrodes of the input transistors, a current source connected to the connection of the input and reference transistor electrodes, and switch-over means including transistors and diodes for switching the input transistors to different threshold voltage values, the switch-over means being connetecd to the control electrode of the reference transistor.

On the basis of the hereinafore described arrangement, the circuit forms a positive-NAND gate with an open collector at the output and two inputs each, and is suited, for instance, for driving relays with a 30-V supply voltage, especially if circuitry with bipolar technology is used. As already stated, the input threshold can be switched to TTL or LSL level.

In accordance with another feature of the invention, the transistors are bipolar transistors, and the input and reference transistors and the current source transistors are of one transistor type and the switch-over means transistors and the Darlington stage transistors are of the opposite transistor type.

In accordance with a further feature of the invention, the input and reference transistors are pnp transistors.

In accordance with an added feature of the invention, the connected current carrying electrodes of the input and reference transistors are the emitter electrodes.

In accordance with an additional feature of the invention, the switch-over means includes a first current source, a first circuit node connected to the first current source and forming the connection of the switch-over means to the control electrode of the reference transistor, a first Zener diode connected in the blocking direction from the first circuit node to ground, a first transistor having its emitter electrode connected to ground, at least one diode connected in the flow direction from the first circuit node to the collector electrode of the first transistor, a second circuit node connected to the control electrode of the first transistor, a first leak resistor connected between the second circuit node and ground, a second current source connected to the second circuit node, a second transistor having its control electrode connected to the second circuit node and its emitter electrode connected to ground, a voltage divider connected to the control electrode of the second transistor, and a third current source, the voltage divider being formed of a series circuit of a second leak resistor connected to ground and a second Zener diode connected in the blocking direction to the second leak resistor with its anode connected to the third current source.

In accordance with yet another feature of the invention, the current source transistors are of the same type as the input and reference transistors, the emitter electrodes of the current source transistors being connected to supply potentials, preferably a common supply potential, the control electrodes of the current source transistors being connected to control potentials, and the connections to the current sources being connected to the collector electrodes of the current source transistors.

In accordance with a concomitant feature of the invention, the Darlington stage includes a first and second transistor and a first and second resistor, the resistors being connected in series between ground and the collector electrode of the reference transistor, the control electrode of the first transistor being additionally connected to the collector electrode of the reference transistor, the emitter electrode of the first transistor and the control electrode of the second transistor being connected to the voltage divider point of the series connected resistors, the emitter electrode of the second transistor being connected to ground, and the collector electrodes of the first and second transistors being connected to the signal output of the circuit.

Other features which are considered as characteristic for the invention are set forth in the appended claims.

Although the invention is illustrated and described herein as embodied in a monolithically integrable logic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
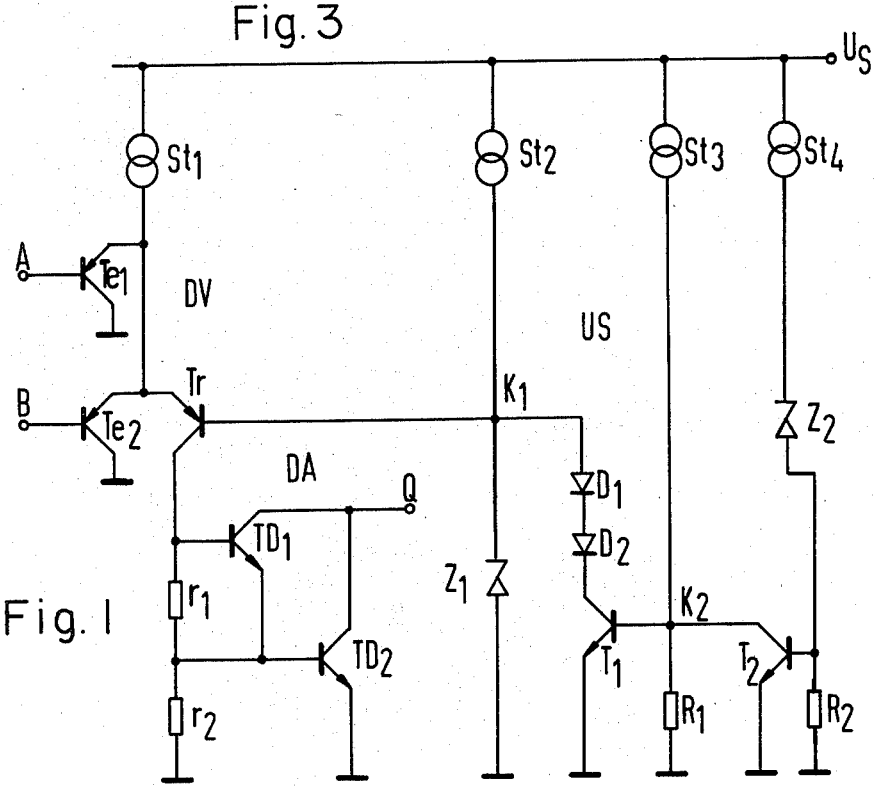
FIG. 1 is a circuit diagram of the logic circuit according to the invention.

Referring now to FIG. 1 of the drawing, there are seen two input transistors $Te_1$ and $Te_2$, which are both of the pnp-type. This also applies to the reference transistor Tr. According to the hereinafore given definition the emitter electrodes of these three transistors $Te_1$, $Te_2$ and Tr are all connected together to the corresponding terminal of a first current source $St_1$. The collectors of the two input transistors $Te_1$ and $Te_2$ are at the common reference potential of the circuit, i.e., at ground potential, while the collector of the reference transistor Tr serves for controlling the Darlington circuit forming the output Q of the logic.

For this purpose, two npn transistors $TD_1$ and $TD_2$ are provided in this embodiment, which are connected together with two resistors $r_1$ and $r_2$ in the manner shown in the figure. The base of the transistor $TD_1$ is connected directly to the collector of the reference transistor Tr, while the voltage drop caused by the resistor $r_1$ is provided between the base of the transistor $TD_1$ and the base of the second transistor $TD_2$. The collectors of the two transistors $TD_1$ and $TD_2$ form the signal output Q of the logic circuit. The emitter of the first transistor $TD_1$ and the base of the second transistor $TD_2$, are both connected to a point in the voltage divider series circuit which is between the hereinafore mentioned first resistor $r_1$, and the second resistor $r_2$ which is connected to the reference potential or ground. The emitter of the second transistor $TD_2$ of the Darlington stage is likewise at reference potential.

The switch-over system contains three current sources $St_2$, $St_3$ and $St_4$, two Zener diodes $Z_1$ and $Z_2$, two further diodes $D_1$ and $D_2$, two npn-transistors $T_1$ and $T_2$ as well as two ohmic resistors connected as follows:

The first of the current sources mentioned, $St_2$, is connected to the cathode of a Zener diode $Z_1$ poled in the blocking direction. The anode of the Zener diode $Z_1$, is at the common reference potential of the system, i.e., at ground. The cathode of the Zener diode $Z_1$, is furthermore connected to the base of the reference transistor Tr of the differential amplifier. Through this connection, a circuit node $K_1$ is provided between the circuit components Tr, $Z_1$ and $St_2$. The node $K_1$ is connected through the two series-connected diodes $D_1$ and $D_2$ to the collector of the npn transistor $T_1$. As seen from $K_1$, the diode $D_1$ and $D_2$ are poled in the flow direction. The emitter of the transistor $T_1$ is connected to the common reference potential or ground, and the base thereof is connected to a further circuit node $K_2$.

This second circuit node $K_2$ is further connected through a resistor $R_1$ to the common reference potential, as well as directly to the collector of the npn-transistor $T_2$ and, in addition, gets its current through direct connection to the current source $St_3$. Furthermore, the emitter of this transistor $T_2$ is connected directly to ground, while its base is acted upon by the last-mentioned current source $St_4$, by way of the second Zener diode $Z_2$. The transistor $T_2$ is furthermore connected to ground through the leak resistor $R_2$.

Figure 3:
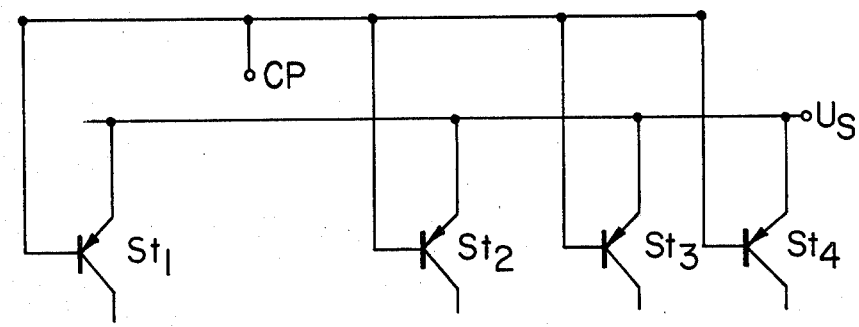
FIG. 3 is a third embodiment of the current sources of the invention.
Figure 2:
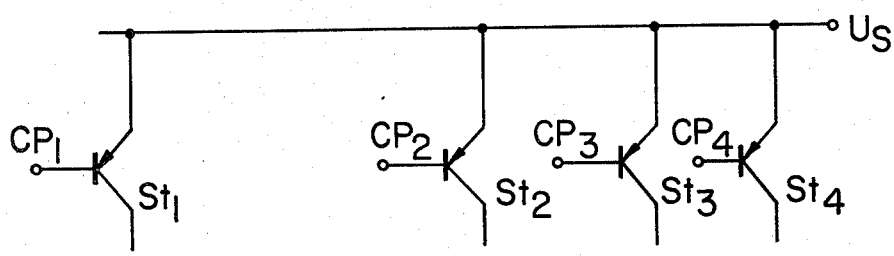
FIG. 2 is a second embodiment of the current sources.

In the embodiment shown in FIGS. 2 and 3, the current sources $St_1$ to $St_4$ are each advantageously comprised of a pnp-transistor, the emitters of which are all connected to the other (in this case, positive) supply potential $U_S$, while the collectors of the respective transistors establish the connection to the one which is to be driven. The base terminals of the power supply transistors are preferably connected to a common current control potential CP as shown in FIG. 3, or each can be connected to a separate control potential $CP_1$–$CP_4$ as shown in FIG. 2. The individual operating potentials are referred to the common reference potential or ground.

The switching threshold at the inputs A and B is about 6.8 V for a supply voltage $U_S$ of about 8 V. If the supply voltage $U_S$ drops below the value mentioned, i.e., 8 V, then the Zener diode $Z_2$ is cut off and the reference voltage or $U_r$ for the threshold at the inputs A and B is switched to about 1.5 V.

Furthermore, if $U_S$ is appreciably smaller than 8 V and the Zener diode $Z_2$ is therefore cut off, the transistor $T_2$ is also cut off and transistor $T_1$ conducts. Thus, a voltage of about 1.5 V is present as a reference voltage at the differential amplifier DV, i.e., the sum of the two diode voltages $D_1$ and $D_2$, whereby the input threshold at A and B, respectively, is fixed at about 1.5 V.

If, on the other hand, the supply voltage $U_S$ is above 8 V, then the Zener diode $Z_2$ and the transistor $T_2$ become conducting, while the transistor $T_1$ is cut off by the circuit described herein. The voltage of the Zener diode $Z_1$ is now present as the reference voltage, so that the input threshold at the inputs A and B is now about 6 to 7 V.

The hereinafore described circuit can be modified without difficulty and without loss of the desired effect. Thus, a similar effect can be obtained by reversing the transistor types in the embodiment example just described, to the opposite type. In the embodiment example, identical Zener diodes $Z_1$ and $Z_2$ were used, which is practically mandatory if the system is integrated monolithically. However, if necessary, different Zener diodes can be used if one does not shy away from the necessary technical complications. The arrangement can also be constructed by using CMOS transistors. Further DV stages can be connected to the node $K_1$ (for instance, a four-fold NAND stage in one case).

In operation, the inputs A and B etc. are addressed by the signal outputs of logic circuits, just as the output Q may be provided for driving other parts of the circuit.

There are claimed:

1. Monolithically integrable logic circuit having at least one NAND function and a Darlington stage serving as the signal output of the circuit, comprising a differential amplifier having its non-inverted output connected to the input of the Darlington stage, said differential amplifier including at least two identical input transistors with control electrodes which form the signal inputs of the circuit and a reference transistor which is identical to said input transistors, said reference transistor having one of its current carrying electrodes connected to the same current carrying electrodes of said input transistors, a current source connected to the connection of said input and reference transistor electrodes, switch-over means including transistors and diodes for switching said input transistors to different threshold voltage values, said switch-over means being connected to the control electrode of said reference transistor and said switch-over means including a first current source, a first circuit node connected to said first current source and forming the connection of said switch-over means to the control electrode of said reference transistor, a first Zener diode connected in the blocking direction from said first circuit node to ground, a first transistor having its emitter electrode connected to ground, at least one diode connected in the flow direction from said first circuit node to the collector electrode of said first transistor, a second circuit node connected to the control electrode of said first transistor, a first leak resistor connected between said second circuit node and ground, a second current source connected to said second circuit node, a second transistor havings its collector electrode connected to said second circuit node and its emitter electrode connected to ground, a voltage divider connected to the control electrode of said second transistor, and a third current source, said voltage divider being formed of a series circuit of a second leak resistor connected to ground and a second Zener diode connected in the blocking direction to said second leak resistor with its cathode connected to said third current source.

2. Circuit according to claim 1, wherein said current sources are transistors, said transistors are bipolar transistors, and said input and reference transistors and the current source transistors are of one transistor type and said switch-over means transistors and the Darlington stage transistors are of the opposite transistor type.

3. Circuit according to claim 1, wherein said input and reference transistors are pnp transistors.

4. Circuit according to claim 1, wherein said connected current carrying elecrodes of said input and reference transistors are the emitter electrodes.

5. Circuit according to claim 1, wherein said current sources are transistors, the current source transistors are of the same type as said input and reference transistors, the emitter electrode of the current source transistors being connected to a supply potential, the control electrodes of the current source transistors being connected to control potentials, and said connections to said current sources being connections to the collector electrodes of the current source transistors.

6. Circuit according to claim 5, wherein said control potentials connected to the control electrodes of the current source transistors are in the form of a common control potential.

7. Circuit according to claim 1, wherein the first-mentioned current source is a transistor which is of the same type as said input and reference transistors, the emitter electrode of the current source transistor being connected to a supply potential, the control electrode of the current source transistor being connected to a control potential, and said connection to said current source being a connection to the collector electrode of the current source transistor.

* * * * *